United States Patent
Tu (10) Patent No.: US 7,490,800 B2
(45) Date of Patent: Feb. 17, 2009

(54) HANGING DEVICE FOR WIRELESS TRANSMISSION MEDIA

(75) Inventor: Kuo Chiang Tu, Linkou Township, Taipei County (TW)

(73) Assignee: Cameo Communications, Inc., Sijhih (TW)

( * ) Notice: Subject to any disclaimer, the term of this patent is extended or adjusted under 35 U.S.C. 154(b) by 73 days.

(21) Appl. No.: 11/593,149

(22) Filed: Nov. 6, 2006

(65) Prior Publication Data

US 2008/0105803 A1 May 8, 2008

(51) Int. Cl.
- A47B 96/00 (2006.01)
- A47K 1/00 (2006.01)
- A47K 5/00 (2006.01)
- E04G 5/06 (2006.01)
- F16L 3/08 (2006.01)
- F21V 21/00 (2006.01)
- F21V 35/00 (2006.01)

(52) U.S. Cl. .......................... 248/225.21; 248/225.11; 248/224.8

(58) Field of Classification Search ............ 248/225.21, 248/225.11, 224.8
See application file for complete search history.

(56) References Cited

U.S. PATENT DOCUMENTS

| | | | | |
|---|---|---|---|---|
| 4,660,793 A | * | 4/1987 | Mark | 248/224.8 |
| 5,035,389 A | * | 7/1991 | Wang | 248/224.51 |
| 5,433,416 A | * | 7/1995 | Johnson | 248/475.1 |
| 5,452,874 A | * | 9/1995 | Kozloff et al. | 248/222.11 |
| 5,608,603 A | * | 3/1997 | Su | 361/680 |
| 5,924,790 A | * | 7/1999 | Ponton et al. | 362/370 |
| 6,237,886 B1 | * | 5/2001 | Katsumata et al. | 248/225.21 |
| 6,520,463 B1 | * | 2/2003 | Ouano | 248/222.13 |
| 6,637,707 B1 | * | 10/2003 | Gates et al. | 248/224.7 |
| 2005/0139745 A1 | * | 6/2005 | Liao et al. | 248/346.01 |

* cited by examiner

*Primary Examiner*—J. Allen Shriver, II
*Assistant Examiner*—Michael McDuffie
(74) *Attorney, Agent, or Firm*—Troxell Law Office PLLC (57) ABSTRACT

A hanging device for a wireless transmission media comprising at least one engaging fastener formed on a housing of the wireless transmission media, and a hanging base. The engaging fastener shaped in an "L" configuration is provided with a sliding hook having a positioning recess formed on an upper surface thereof, a connecting portion, and a rib projected from a center portion of an inner surface of the sliding hook adjacent to the connecting portion. The hanging base is provided with at least one engaging recess which includes an inserting portion and a sliding portion, wherein the inserting portion has an elastically positioning piece and a positioning projection while the sliding portion has a slide track, a sliding opening, and a positioning frame. The sliding hook of the engaging fastener is used to insert into the inserting portion of the engaging recess, and elastically bias the elastically positioning piece formed on a bottom portion of the engaging recess so that the rib can be aligned with the sliding opening of the sliding portion, and then inserted into the slide track. When the rib of the engaging fastener is slid to an end along the slide track, the sliding hook is inserted into the positioning frame, and then the positioning recess will engage with the positioning projection so as to stably retain the engaging fastener in the engaging recess.

7 Claims, 6 Drawing Sheets

HANGING DEVICE FOR WIRELESS TRANSMISSION MEDIA

BACKGROUND OF INVENTION

1. Field of the Invention

The present invention relates to a hanging device for a wireless transmission media, and more particularly to a hanging device comprising an engaging fastener formed on a lower housing of a housing of a wireless transmission media, and an engaging recess formed on a hanging base for engaging with each other so as to stably retain the wireless transmission media on a wall surface or a ceiling surface.

2. Description of the Prior Art

Due to advances in Internet-related information, methods for accessing the Internet not only include traditional wired transmission technology, but also novel wireless transmission technology, which is a new accessing trend based on the increasing needs of users. The wireless transmission technology is advantageous to reduce the unnecessary use of networking cables and to provide mobile internet access for more users so as to access the Internet without being limited by spatial barriers or location.

However, general wireless transmission technology works only when using wireless transmission media, such as a wireless router or a wireless access point, for linking to the Internet. Furthermore, for transmitting without being limited by spatial barriers, the wireless transmission media is generally hung at a higher position, such as on a wall surface or a ceiling surface, to reduce spatial limitations and increase Internet accessibility.

Figure 1A:
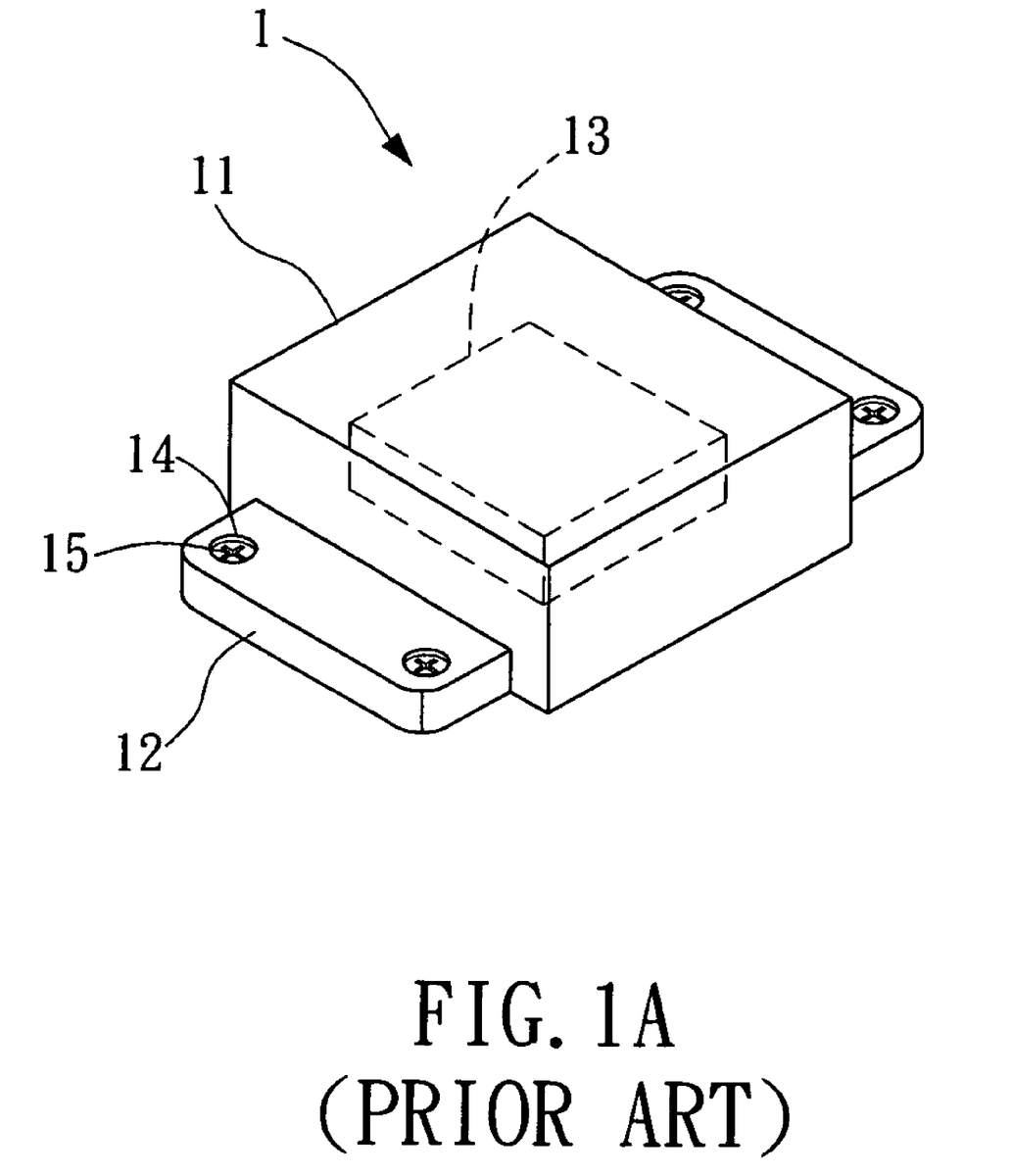
FIG. 1A is a perspective view of a conventional hanging device for a wireless transmission media.

Referring now to FIG. 1A, a perspective view of a conventional hanging device for a wireless transmission media is illustrated, which is designated by numeral 1, and comprises a housing 11 and a hanging portion 12. The housing 11 is provided with a wireless transmission module 13 therein. The hanging portion 12 is formed with at least one screwing hole 14 for mounting the wireless transmission media on a wall surface by screw-connecting at least one screw 15. However, when some repair, function extension, or battery exchange is executed with respect to the wireless transmission media, a user must use hand tools to manually take the hanging device 1 of the wireless transmission media apart from the wall surface resulting in inconvenience during disengagement.

Figure 1B:
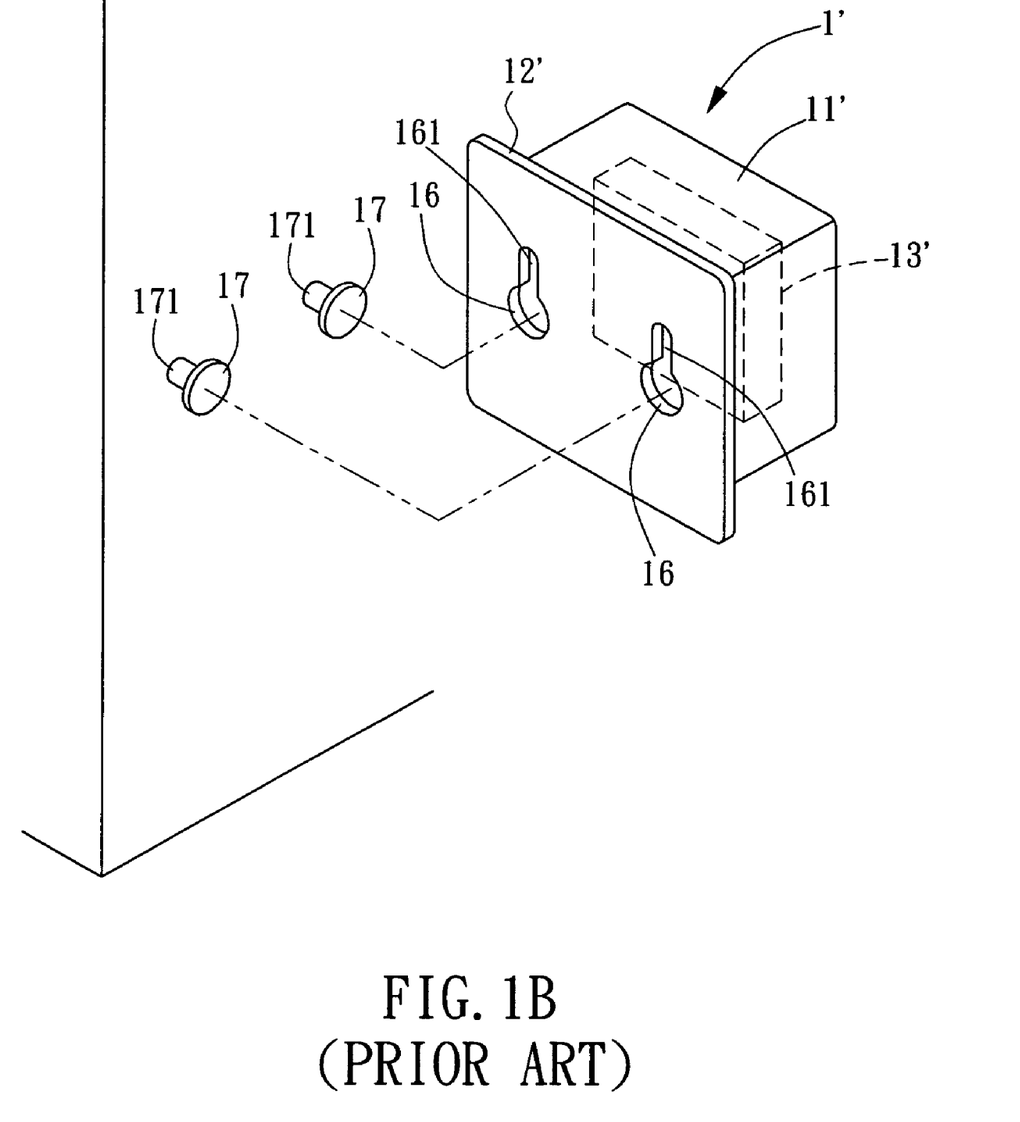
FIG. 1B is a perspective view of another conventional hanging device for a wireless transmission media.

Referring now to FIG. 1B, a perspective view of another conventional hanging device for a wireless transmission media is illustrated, which is designated by numeral 1', and comprises a housing 11' and a hanging portion 12'. The housing 11' is provided with a wireless transmission module 13' therein. The hanging portion 12' is formed with at least one positioning hole 16 for mounting the wireless transmission media on a wall surface or a ceiling surface by engaging with at least one engaging portion 17 on the wall surface or the ceiling surface. Furthermore, the positioning hole 16 comprises a slot 161, and a neck portion 171 is formed at a center portion of one side of the engaging portion 17 facing the wall surface or ceiling surface. After the engaging portion 17 is inserted into the positioning hole 16, the neck portion 171 of the engaging portion 17 will slide into and engage with the slot 161 so that the engaging portion 17 can extend into the hanging device 1' for mounting the wireless transmission media on a wall surface or a ceiling surface. Although the hanging device 1' is useful when taking the wireless transmission media apart from the wall surface or the ceiling surface, the wireless transmission media may unexpectedly fall from the wall surface or the ceiling surface if the wireless transmission media is impacted or vibrated. As a result, the hanging device 1' still can not provide sufficient stability for retaining the wireless transmission media.

SUMMARY OF INVENTION

A primary object of the present invention is to provide a hanging device, which is provided with an engaging fastener and an engaging recess for engaging with each other, wherein the engaging fastener is formed with a rib to slide into a slide track of the engaging recess. When the rib of the engaging fastener is slid to an end along the slide track, a positioning recess formed on an upper surface of the engaging fastener will engage with a positioning projection of the engaging recess so as to be convenient and easy to stably retain the hanging device without vibration.

A secondary object of the present invention is to provide a hanging device for a wireless transmission media, which is provided with an engaging fastener and an engaging recess for quickly engaging with each other, so as to quickly and stably retain the wireless transmission media at a higher position, and such that it is convenient to easily take the wireless transmission media apart therefrom when repairing or updating it.

BRIEF DESCRIPTION OF THE DRAWINGS

The details of the present invention will be more readily understood from a detailed description of the preferred embodiments taken in conjunction with the following figures.

DETAILED DESCRIPTION

Figure 2:
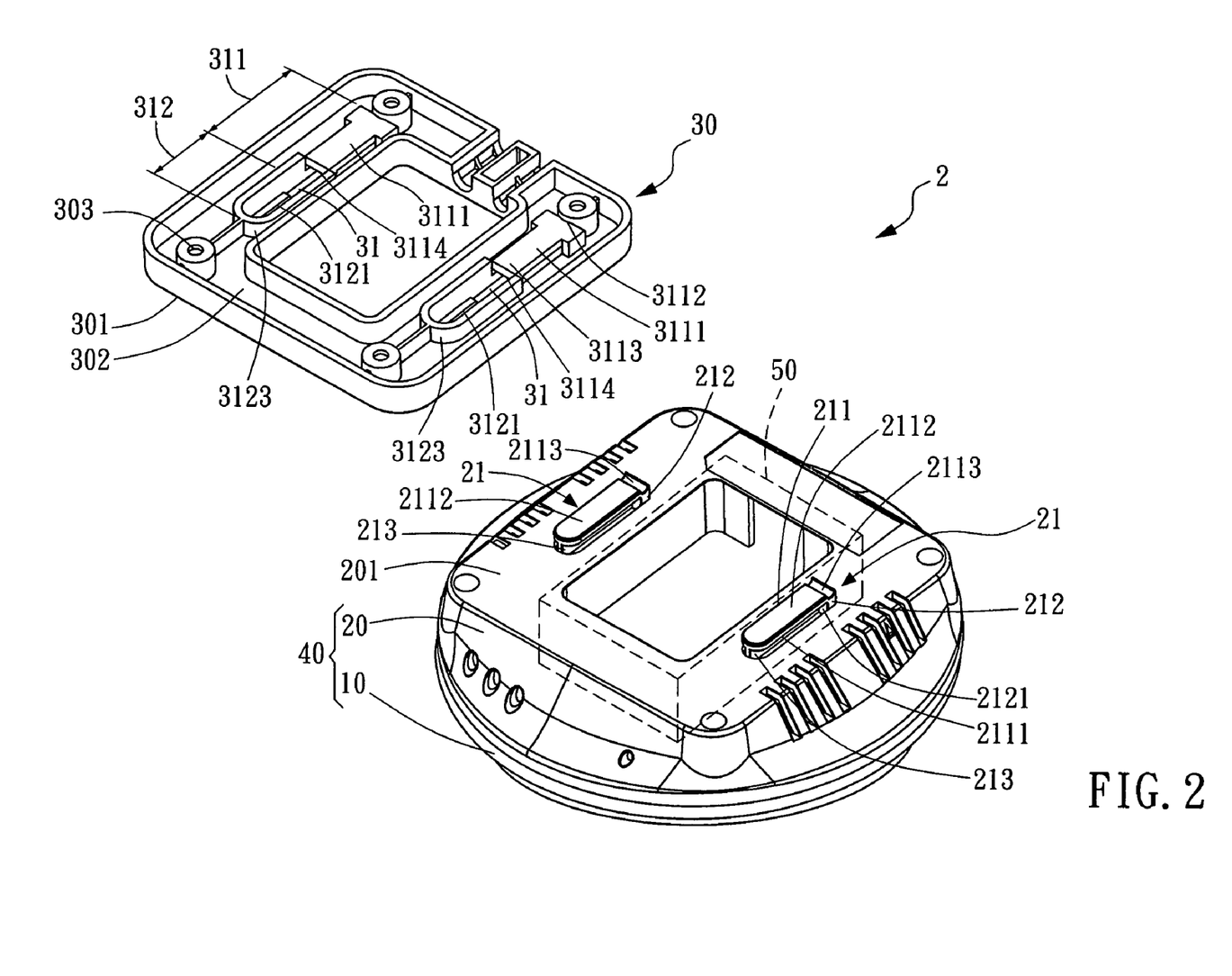
FIG. 2 is an exploded perspective view of a hanging device for a wireless transmission media according to a preferred embodiment of the present invention.

Referring now to FIG. 2, an exploded perspective view of a hanging device for a wireless transmission media according to a preferred embodiment of the present invention is illustrated. As shown, the hanging device designated by numeral 2 of the present invention comprises an upper housing 10, a lower housing 20, and a hanging base 30. The upper housing 10 can be connected with the lower housing 20 to constitute a hollow housing 40 in which a wireless transmission module 50 is received in a receiving space (unlabeled) formed between the upper housing 10 and the lower housing 20. The wireless transmission module 50 can be selected from the group comprising: wireless router, wireless IP sharing device, and wireless access point.

Referring still to FIG. 2, the lower housing 20 has a rear side 201 (also called a bottom side) opposite to a connecting side (unlabeled) which is used for connecting the upper housing 10, and the rear side 201 (bottom side) of the lower housing 20 is provided with at least one engaging fastener 21 at a suitable position. The engaging fastener 21 includes a sliding hook 211 and a connecting portion 212. One end of the connecting portion 212 is connected to the lower housing 20 and projects from the rear side 201 (bottom side). The sliding hook 211 of the engaging fastener 21 is horizontally extended from the other end of the connecting portion 212 about a predetermined length along a horizontal level relative to the rear side 201 (bottom side). Thus, the sliding hook 211 and the connecting portion 212 of the engaging fastener 21 are vertically connected to each other so that the engaging fastener 21 is shaped in an "L" configuration. Meanwhile, the sliding hook 211 is higher than the rear side 201 (bottom side) about a predetermined height. In the preferred embodiment, the distance (i.e. the predetermined height) between the sliding hook 211 and the rear side 201 (bottom side) is substantially equal to or slightly greater than the thickness (i.e. the depth) of a slide track 3121 which will be described in more detail hereinafter. Furthermore, a rib 213 is projected from a center portion of an inner surface 2111 and 2121 of the sliding hook 211 adjacent to the connecting portion 212. The rib 213 is extended along the sliding hook 211 about a predetermined length. In the preferred embodiment, the extended length of the rib 213 is substantially equal to that of the sliding hook 211. Alternatively, in another preferred embodiment, the extended length of the rib 213 may be different from that of the sliding hook 211, wherein one end of the rib 213 may be projected from or (recessed in) relative to one end of the sliding hook 211 opposite to the other end close to the connecting portion 212. Besides, the sliding hook 211 has an upper surface 2112, and the upper surface 2112 is formed with a positioning recess 2113 adjacent to the connecting portion 212.

Referring back to FIG. 2, the hanging base 30 is used to detachably mount a wireless transmission media on a surface, and comprises a connecting side 301, a mounting side 302, and at least one screwing hole 303. The connecting side 301 is formed with at least one engaging recess 31 at a suitable portion, wherein the engaging recess 31 is an elongated slot including an inserting portion 311 and a sliding portion 312. The inserting portion 311 has a configuration and an outline for correspondingly engaging with the sliding hook 211 of the engaging fastener 21. The sliding portion 312 is extended from one end of the inserting portion 311 about a predetermined length. The hanging base 30 can be mounted on a surface, such as a wall surface or a ceiling surface, by screw-connecting at least one screw (not shown) to the screwing hole 303. Alternatively, the hanging base 30 can be mounted on a surface by other conventional mounting technologies.

Figure 3:
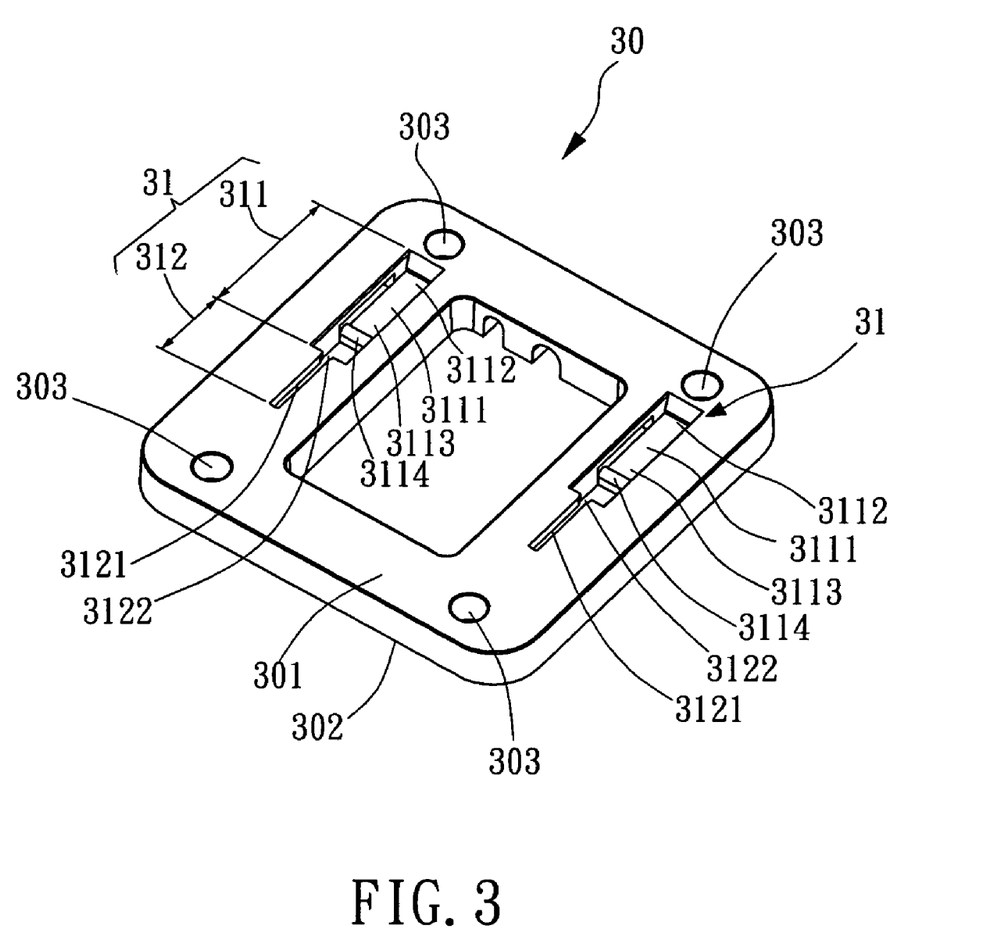
FIG. 3 is a perspective view of a connecting side of a hanging base of the hanging device for the wireless transmission media according to the preferred embodiment of the present invention.

Referring now to FIG. 3, a perspective view of the connecting side 301 of the hanging base 30 of the hanging device 2 for the wireless transmission media according to the preferred embodiment of the present invention is illustrated while referring to FIG. 2 by reference. A bottom portion of the inserting portion 311 of the engaging recess 31 is formed with an elastically positioning piece 3111 which has a connecting end 3112 for connecting with a side wall of the engaging recess 31 so as to define the elastically positioning piece 3111 as a bottom portion of the engaging recess 31. Furthermore, the elastically positioning piece 3111 has an engaging end 3113 opposite to the connecting end 3112. The engaging end 3113 of the elastically positioning piece 3111 is formed with a positioning projection 3114 facing an inner space of the engaging recess 31.

Referring still to FIGS. 2 and 3, the sliding portion 312 of the engaging recess 31 is an extended portion extended from the inserting portion 311. The sliding portion 312 includes a slide track 3121 as described above, which is an elongated slot having a slide opening 3122. A height difference is defined between the slide track 3121 and the elastically positioning piece 3111 of the inserting portion 311, i.e. the depth of the engaging recess 31. In the preferred embodiment, the depth of the engaging recess 31 (i.e. the height difference) is substantially equal to or slightly greater than the thickness (i.e. the height) of the sliding hook 211 while the width of the slide track 3121 is substantially equal to or slightly greater than the thickness of the rib 213. As described above, the engaging recess 31 is substantially formed with a receiving space (unlabeled) which is behind the slide track 3121 and facing the mounting side 302. The receiving space is used for receiving the sliding hook 211 of the engaging fastener 21 which inserts into the slide track 3121 from the inserting portion 311.

Referring back to FIGS. 2 and 3, when the sliding hook 211 of the engaging fastener 21 inserts into the inserting portion 311, the sliding hook 211 slightly biases the positioning projection 3114 on the elastically positioning piece 3111 to generate an elastic bias while the rib 213 of the engaging fastener 21 is aligned with the slide track 3121, and then inserted into the slide track 3121 so that the positioning projection 3114 and the positioning recess 2113 engage with each other.

Referring to FIGS. 2 and 3, the slide track 3121 is used to receive the rib 213 of the engaging fastener 21, wherein the rib 213 inserts into the slide track 3121 from a connecting portion between the inserting portion 311 and the slide track 3121, i.e. the sliding opening 3122 of the slide track 3121. The receiving space which is facing the mounting side 302 of the hanging base 30 and behind the slide track 3121 is surrounded by a positioning frame 3123 substantially shaped in a "U" configuration. The positioning frame 3123 has an opening facing the inserting portion 311 and corresponding to the engaging end 3113 of the elastically positioning piece 3111. Thus, when the sliding hook 211 of the engaging fastener 21 is slid to an end along the slide track 3121 by the rib 213, the sliding hook 211 will be guided into the positioning frame 3123 on the mounting side 302 from the inserting portion 311 of the engaging recess 31. Moreover, due to an inner circumference of the positioning frame 3123 that corresponds to an outer circumference of the sliding hook 211, the sliding hook 211 will be stably retained without vibration.

Figure 4:
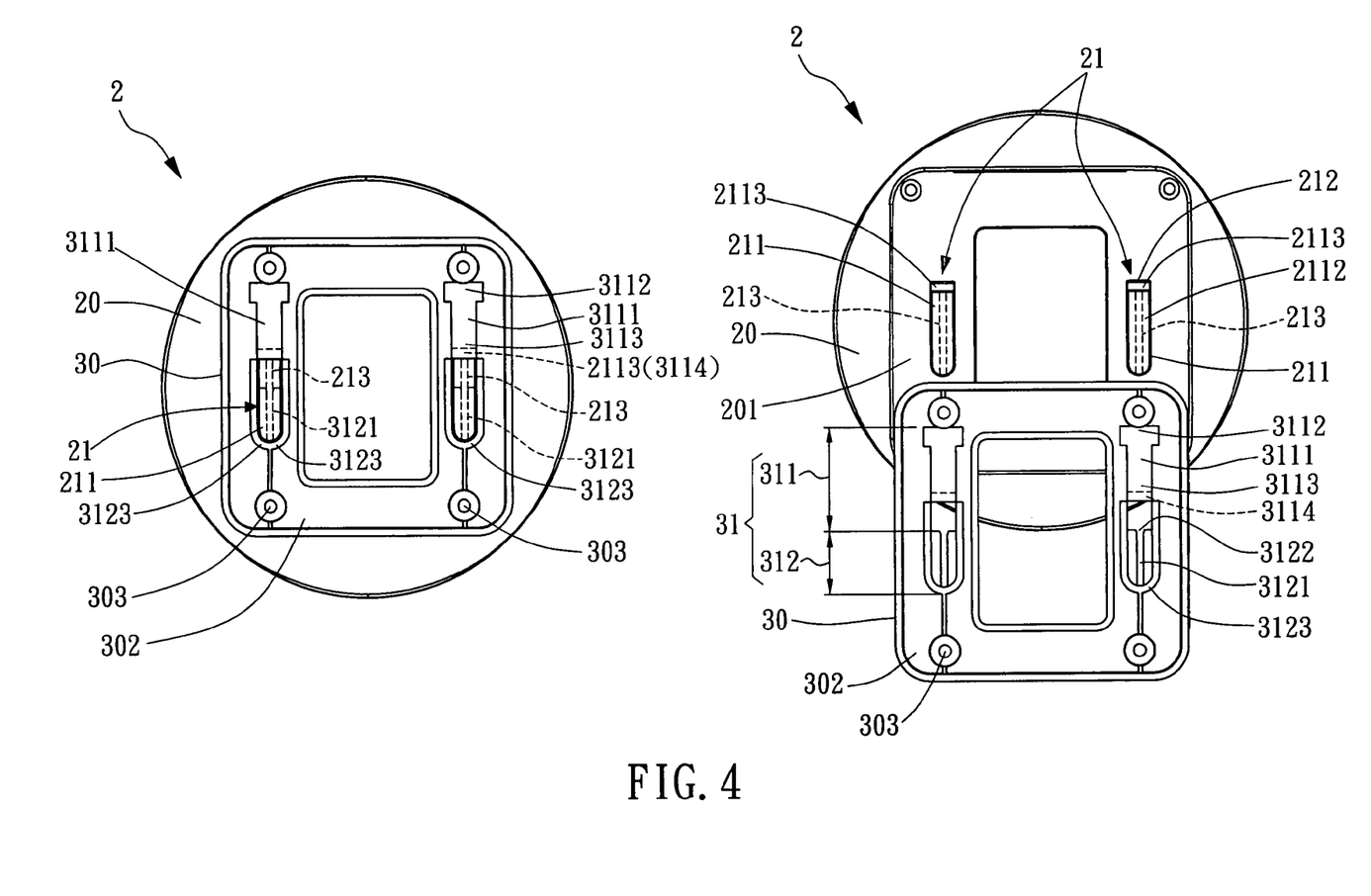
FIG. 4 is an assembled view of the hanging device for the wireless transmission media according to the preferred embodiment of the present invention.

Referring now to FIG. 4, an assembled view of the hanging device 2 for the wireless transmission media according to the preferred embodiment of the present invention is illustrated while referring to FIG. 2 by reference. When assembling the hanging device 2 for the wireless transmission media, the engaging fastener 21 formed on the rear side 201 of the lower housing 20 will be engaged with the engaging recess 31 formed on the connecting side 301 of the hanging base 30 mounted on the wall surface.

Referring still to FIGS. 2 and 4, in the preferred embodiment, the inserting portion 311 of the engaging recess 31 is used to entirely receive the sliding hook 211 of the engaging fastener 21 while the sliding hook 211 slight biases the elastically positioning piece 3111 formed on the bottom portion of the engaging recess 31 to generate an elastic bias. Meanwhile, the rib 213 of the engaging fastener 21 is aligned with the sliding opening 3122 of the sliding portion 312, and the rib 213 can be pushed into the slide track 3121 so that the sliding hook 211 is slid from the engaging recess 31 to the positioning frame 3123 of the hanging base 30. The positioning frame 3123 is used to retain the sliding hook 211 while the positioning projection 3114 on the elastically positioning piece 3111 is engaged with the positioning recess 2113 of the sliding hook 211 so that the engaging fastener 21 and the engaging recess 31 can tightly engage with each other.

Figure 5:
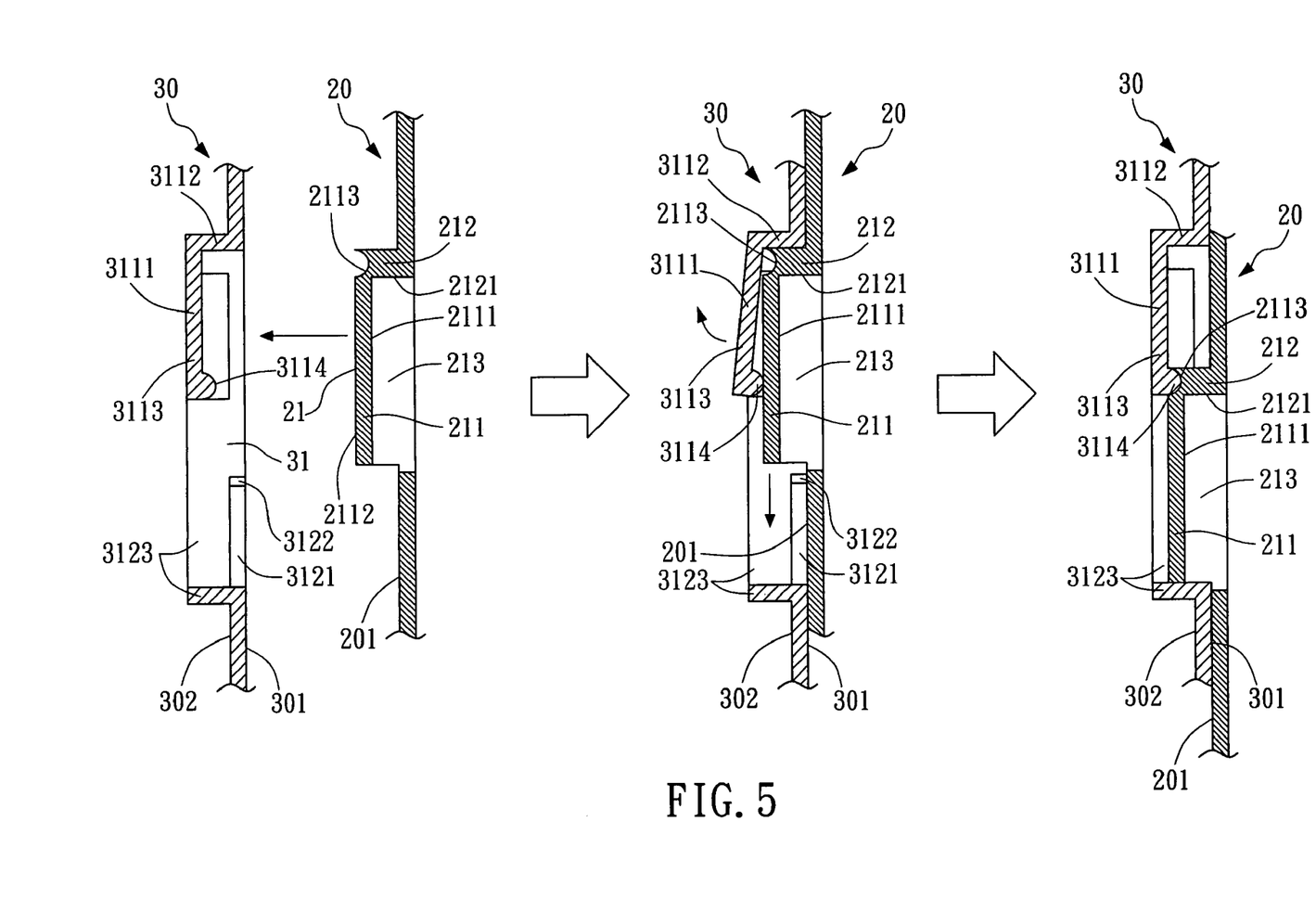
FIG. 5 is a cross-sectional view of an engaging fastener and an engaging recess of the hanging device for the wireless transmission media according to the preferred embodiment of the present invention during assembly.

Referring now to FIG. 5, cross-sectional views of the engaging fastener 21 and the engaging recess 31 of the hanging device 2 for the wireless transmission media according to the preferred embodiment of the present invention during assembly is illustrated while referring to FIG. 4 by reference. When the engaging fastener 21 is entirely received in the engaging recess 31, the engaging fastener 21 slightly biases the elastically positioning piece 3111 in the engaging recess 31 to generate an elastic bias so that the sliding hook 211 of the engaging fastener 21 slides into the positioning frame 3123 of the engaging recess 31 followed by aligning the rib 213 with the sliding opening 3122. Then, when the rib 213 of the engaging fastener 21 is guided toward the sliding portion 312 in an engaging manner, the rib 213 will be slid to an end along the slide track 3121 of the sliding portion 312 while the sliding hook 211 will approach an end of the positioning frame 3123. Meanwhile, the positioning recess 2113 of the engaging fastener 21 and the positioning projection 3114 on the elastically positioning piece 3111 engage with each other so as to stably retain the engaging fastener 21 in the engaging recess 31.

Referring still to FIGS. 4 and 5, in another aspect, when the engaging fastener 21 is disengaged from the engaging recess 31, the engaging fastener 21 can be reversely pushed by a sufficient external force from the sliding portion 312 back to the inserting portion 311. As a result, the elastically positioning piece 3111 is biased by the engaging fastener 21, and the positioning projection 3114 on the elastically positioning piece 3111 will be disengaged from the positioning recess 2113 of the engaging fastener 21 with the result that the sliding hook 211 is returned to the inserting portion 311 along the slide track 3121 for smoothly taking the engaging fastener 21 apart from the engaging recess 31.

According to the preferred embodiment of the present invention, the hanging device 2 for the wireless transmission media is made of at least one material selected from the group comprising: macromolecular resin, plastic steel, polyethylene (PE), polypropylene (PP), acrylonitrile-butadiene-styrene (ABS), and polycarbonate (PC).

As described above, the hanging device 2 for the wireless transmission media according to the preferred embodiment of the present invention is provided with the engaging fastener 21 formed on the rear side 201 of the lower housing 20, and the engaging recess 31 formed on the connecting side 301 of the hanging base 30 mounted on a wall surface or a ceiling surface, wherein the engaging fastener 21 and the engaging recess 31 can engage with each other. Furthermore, the engaging fastener 21 is received in the engaging recess 31, and then biases the elastically positioning piece 3111 so that the rib 213 of the engaging fastener 21 can be aligned with the slide track 3121 of the engaging recess 31. Then, the rib 213 is pushed into the slide track 3121, and the sliding hook 211 will be inserted into the positioning frame 3123 formed on the mounting side 302 from the engaging recess 31 for retaining the engaging fastener 21. Meanwhile, the positioning recess 2113 of the engaging fastener 21 and the positioning projection 3114 on the elastically positioning piece 3111 can engage with each other while the slide track 3121 and the positioning frame 3123 are used to retain the rib 213 and the sliding hook 211 of the engaging fastener 21, respectively, without any vibration. Furthermore, the positioning recess 2113 of the engaging fastener 21 and the positioning projection 3114 on the elastically positioning piece 3111 can engage with each other to prevent the engaging fastener 21 from disengaging from the engaging recess 31. In another preferred embodiment of the present invention, at least one engaging recess (not shown) can be selectively formed on the hollow housing 40 of the wireless transmission media, and at least one engaging fastener (not shown) can be selectively formed on the hanging base 30 for correspondingly engaging with the engaging fastener.

The present invention has been described with a preferred embodiment thereof and it is understood that many changes and modifications in the described embodiment can be carried out without departing from the scope and the spirit of the invention, which is intended to be limited only by the appended claims.

What is claimed is:

1. A hanging device for a wireless transmission media, comprising:
    a housing having one side provided with at least one engaging fastener, the engaging fastener further comprising:
        a sliding hook slightly projected from the side of the housing;
        a connecting portion connected between one end of the sliding hook and the housing;
        a rib formed on an inner surface of the sliding hook adjacent to the connecting portion, the rib extended along the sliding hook about a predetermined length; and
        a positioning recess formed on an upper surface of the sliding hook adjacent to the connecting portion; and
    a hanging base having a connecting side and a mounting side, the connecting side provided with at least one engaging recess, the engaging recess comprising:
        an inserting portion formed with an elastically positioning piece and a positioning projection on the elastically positioning piece, the inserting portion being aligned with the sliding hook of the engaging fastener for receiving the sliding hook; and
        a sliding portion having a slide track corresponding to the rib of the engaging fastener;
    wherein when the sliding hook of the engaging fastener inserts into the inserting portion, the sliding hook slightly biases the positioning projection on the elastically positioning piece to generate an elastic bias while the rib of the engaging fastener is aligned with the slide track for inserting into the slide track so that the positioning projection and the positioning recess engage with each other,
    wherein said housing is provided with a wireless transmission module therein, and the wireless transmission module is selected from the group comprising: wireless router, wireless IP sharing device, and wireless access point.

2. The hanging device for the wireless transmission media as claimed in claim 1, wherein said hanging base is formed with at least one screwing hole, and mounted on a wall surface or a ceiling surface by screw-connecting at least one screw to the screwing hole.

3. The hanging device for the wireless transmission media as claimed in claim 1, wherein said hanging device is made of at least one material selected from the group comprising: macromolecular resin, plastic steel, polyethylene, polypropylene, acrylonitrile-butadiene-styrene, and polycarbonate.

4. The hanging device for the wireless transmission media as claimed in claim 1, wherein said housing comprises an upper housing and a lower, housing, the engaging fastener is formed on a bottom side of the lower housing, and a receiving space is formed between the upper housing and the lower housing for receiving the wireless transmission media.

5. A hanging device for detachably mounting a wireless transmission media on a surface, the hanging device comprising:
- a hanging base for mounting on the surface; at least one engaging fastener further comprising:
  - a connecting portion;
  - a sliding hook extended from one end of the connecting portion about a predetermined length; and
  - a rib formed on an inner surface of the sliding hook adjacent to the connecting portion, the rib extended along the sliding hook; and
- at least one engaging recess further comprising:
  - an inserting portion being aligned with the sliding hook of the engaging fastener for receiving the sliding hook; and
  - a sliding portion having a slide track corresponding to the rib of the engaging fastener, wherein when the sliding hook of the engaging fastener inserts into the inserting portion, the rib is aligned with the slide track for inserting into the slide track so that the positioning projection is engaged with the positioning recess;
- wherein one of the engaging fastener and the engaging recess is formed on the wireless transmission media, and the other of the engaging fastener and the engaging recess is formed on the hanging base,
- wherein said housing is provided with a wireless transmission module therein, and the wireless transmission module is selected from the group comprising: wireless router, wireless IP sharing device, and wireless access point.

6. The hanging device for detachably mounting the wireless transmission media on the surface as claimed in claim 5, wherein said inserting portion is formed with an elastically positioning piece and a positioning projection on an end of the elastically positioning piece while an upper surface of the sliding hook adjacent to the connecting portion is formed with a positioning recess, and wherein after the rib of the engaging fastener inserts into the slide track, the positioning projection and the positioning recess engage with each other for retaining the engaging fastener in the engaging recess.

7. The hanging device for the wireless transmission media as claimed in claim 5, wherein said hanging base is formed with at least one screwing hole, and mounted on a wall surface or a ceiling surface by screw-connecting at least one screw to the screwing hole.

* * * * *